United States Patent
Nakano et al.

(10) Patent No.: US 10,566,172 B2
(45) Date of Patent: Feb. 18, 2020

(54) CHARGED PARTICLE BEAM APPARATUS AND METHOD FOR ADJUSTING IMAGING CONDITIONS FOR THE SAME

(71) Applicant: Hitachi High-Technologies Corporation, Minato-ku, Tokyo (JP)

(72) Inventors: Tomohito Nakano, Tokyo (JP); Toshiyuki Yokosuka, Tokyo (JP); Yuko Sasaki, Tokyo (JP); Minoru Yamazaki, Tokyo (JP); Yuzuru Mochizuki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 16/184,107

(22) Filed: Nov. 8, 2018

(65) Prior Publication Data
US 2019/0172676 A1   Jun. 6, 2019

(30) Foreign Application Priority Data

Dec. 1, 2017  (JP) ................. 2017-231349

(51) Int. Cl.
*H01J 37/21* (2006.01)
*H01J 37/141* (2006.01)
(Continued)

(52) U.S. Cl.
CPC ............ *H01J 37/21* (2013.01); *H01J 37/141* (2013.01); *H01J 37/20* (2013.01); *H01J 37/222* (2013.01);
(Continued)

(58) Field of Classification Search
CPC .......... H01J 37/21; H01J 37/141; H01J 37/20; H01J 37/222; H01J 37/244; H01J 37/28;
(Continued)

(56) References Cited

U.S. PATENT DOCUMENTS

| | | | |
|---|---|---|---|
| 2003/0205678 A1* | 11/2003 | Notte, IV ............... | B82Y 15/00 250/423 F |
| 2005/0072920 A1* | 4/2005 | Inada ..................... | G01N 23/04 250/311 |

(Continued)

FOREIGN PATENT DOCUMENTS

JP   2008-192521 A   8/2008

*Primary Examiner* — Nicole M Ippolito
(74) *Attorney, Agent, or Firm* — Crowell & Moring LLP (57) ABSTRACT

A charged particle beam apparatus with reduced frequency of lens resetting operations and thus with improved throughput. The apparatus includes an electron source configured to generate an electron beam, an objective lens to which coil current is adapted to be applied to converge the electron beam on a sample, a focal position adjustment device configured to adjust the focal position of the electron beam, a detector configured to detect electrons from the sample, a display unit configured to display an image of the sample in accordance with a signal from the detector, a storage unit configured to store information on the hysteresis characteristics of the objective lens, and an estimation unit configured to estimate a magnetic field generated by the objective lens on the basis of the coil current, the amount of adjustment of the focal position by the focal position adjustment device, and the information on the hysteresis characteristics.

15 Claims, 10 Drawing Sheets

(51) Int. Cl.
*H01J 37/244* (2006.01)
*H01J 37/22* (2006.01)
*H01J 37/20* (2006.01)
*H01J 37/28* (2006.01)

(52) U.S. Cl.
CPC .......... *H01J 37/244* (2013.01); *H01J 37/28* (2013.01); *H01J 2237/141* (2013.01); *H01J 2237/216* (2013.01); *H01J 2237/2809* (2013.01)

(58) Field of Classification Search
CPC ........... H01J 2237/141; H01J 2237/216; H01J 2237/2809
USPC .................. 250/306, 307, 309, 310, 311
See application file for complete search history.

(56) References Cited

U.S. PATENT DOCUMENTS

| | | | | |
|---|---|---|---|---|
| 2008/0067396 A1* | 3/2008 | Ohshima | ............... | H01J 37/143 250/396 ML |
| 2008/0185519 A1* | 8/2008 | Takahashi | ............ | G01N 23/225 250/311 |

* cited by examiner

| Iobj | ΔIobj | ΔIhys | ΔVhys | ΔBhys |
|---|---|---|---|---|
| Is1 | ΔIobj11 | ΔIhys11 | ΔVhys11 | ΔBhys11 |
| Is1 | ΔIobj12 | ΔIhys12 | ΔVhys12 | ΔBhys12 |
| ⋮ | ⋮ | ⋮ | ⋮ | ⋮ |
| Is2 | ΔIobj21 | ΔIhys21 | ΔVhys21 | ΔBhys21 |
| Is2 | ΔIobj22 | ΔIhys22 | ΔVhys22 | ΔBhys22 |
| ⋮ | ⋮ | ⋮ | ⋮ | ⋮ |
| Is3 | ΔIobj31 | ΔIhys31 | ΔVhys31 | ΔBhys31 |
| Is3 | ΔIobj32 | ΔIhys32 | ΔVhys32 | ΔBhys32 |
| ⋮ | ⋮ | ⋮ | ⋮ | ⋮ |

CHARGED PARTICLE BEAM APPARATUS AND METHOD FOR ADJUSTING IMAGING CONDITIONS FOR THE SAME

CROSS REFERENCE TO RELATED APPLICATIONS

The present application claims priority from Japanese patent application JP 2017-231349, filed on Dec. 1, 2017, the content of which is hereby incorporated by reference into this application.

BACKGROUND

Technical Field

The present invention relates to a charged particle beam apparatus and a method for adjusting the imaging conditions for the charged particle beam apparatus.

Background Art

As a charged particle beam apparatus, a scanning electron microscope (SEM) is known, for example. Examples of the charged particle beam apparatus include an ordinary scanning electron microscope, a length-measuring SEM, and a review SEM.

A scanning electron microscope captures an image of a sample by irradiating the sample with an electron beam emitted from an electron source using a magnetic field generated by an objective lens, and measuring backscattered electrons, secondary electrons, and the like generated from the sample. At this time, the focal position of the electron beam should be adjusted in accordance with the height of the sample, and this can be achieved by adjusting the amount of coil current applied to the objective lens.

SUMMARY

However, since a magnetic circuit of an objective lens is typically formed of a ferromagnetic material, the relationship between coil current and a magnetic field generated by the objective lens cannot be uniquely determined due to the influence of magnetic hysteresis. This would cause errors in the deflection magnification and image rotation. As a method for avoiding such errors, for example, JP 2008-192521 A discloses an electron microscope that executes a lens reset process to maintain a constant relationship between coil current and a magnetic field of an objective lens. The lens reset operation is an operation of once reducing coil current of an objective lens to the minimum value and then increasing the coil current again, thereby demagnetizing the magnetic circuit of the objective lens. Accordingly, the relationship between coil current and a magnetic field can be uniquely determined. However, in such a lens reset process, since the amount current applied to the objective lens is greatly changed, eddy current is generated in the magnetic circuit, which in turn delays a response of a magnetic field and thus significantly decreases the throughput (i.e., the number of images captured per hour).

The present invention provides a charged particle beam apparatus with reduced frequency of lens resetting operations and thus with improved throughput, and a method for adjusting the imaging conditions for the charged particle beam apparatus.

Accordingly, the charged particle beam apparatus in accordance with the present invention includes an electron source configured to generate an electron beam, an objective lens to which coil current is adapted to be applied to converge the electron beam on a sample, a focal position adjustment device configured to adjust the focal position of the electron beam, a detector configured to detect electrons from the sample, a display unit configured to display an image of the sample in accordance with a signal from the detector, a storage unit configured to store information on the hysteresis characteristics of the objective lens, and an estimation unit configured to estimate a magnetic field generated by the objective lens on the basis of the coil current, the amount of the adjustment of focal position by the focal position adjustment device, and the information on the hysteresis characteristics.

In addition, the method for adjusting the imaging conditions for a charged particle beam apparatus in accordance with the present invention is a method for adjusting the imaging conditions for a charged particle beam apparatus including an electron source configured to generate an electron beam, and an objective lens to which coil current is adapted to be applied to converge the electron beam on a sample, the method including acquiring information on the hysteresis characteristics of the objective lens, executing a lens reset operation in which a magnetic circuit of the objective lens is demagnetized, determining the coil current, adjusting the focal position of an electron beam using a focal position adjustment device, estimating a magnetic field generated by the objective lens on the basis of the coil current, the amount of variation of the coil current, the amount of adjustment of the focal position, and the information on the hysteresis characteristics, and adjusting imaging conditions in accordance with the estimated magnetic field.

According to the present invention, a charged particle beam apparatus with reduced frequency of lens resetting operations and thus with improved throughput can be provided.

DETAILED DESCRIPTION

Hereinafter, embodiments will be described with reference to the accompanying drawings. In the drawings, elements with the same functions may be denoted by the same reference numerals. Although the accompanying drawings illustrate embodiments and implementations in accordance with the principle of the present disclosure, these are merely for the understanding of the present disclosure and should never be used for narrowly construing the present disclosure. The descriptions of the present specification are merely illustrative examples, and should not limit the scope of the claims or examples of the application of the present disclosure in any sense.

Although the following embodiments are described in sufficient detail for those skilled in the art to carry out the present disclosure, it should be understood that other embodiments or implementations are also possible, and the configurations or structures of the embodiments can be changed or a variety of elements of the embodiments can be replaced with other elements within the spirit and scope of the present disclosure. Therefore, the following description should not be construed by being limited thereto.

Although a scanning electron microscope will be described as an example of a charged particle beam apparatus in the following embodiments, the present invention is also applicable to other types of charged particle beam apparatuses (e.g., a length-measuring SEM, and a review SEM) within the spirit and scope of the present invention.

First Embodiment

Figure 1:
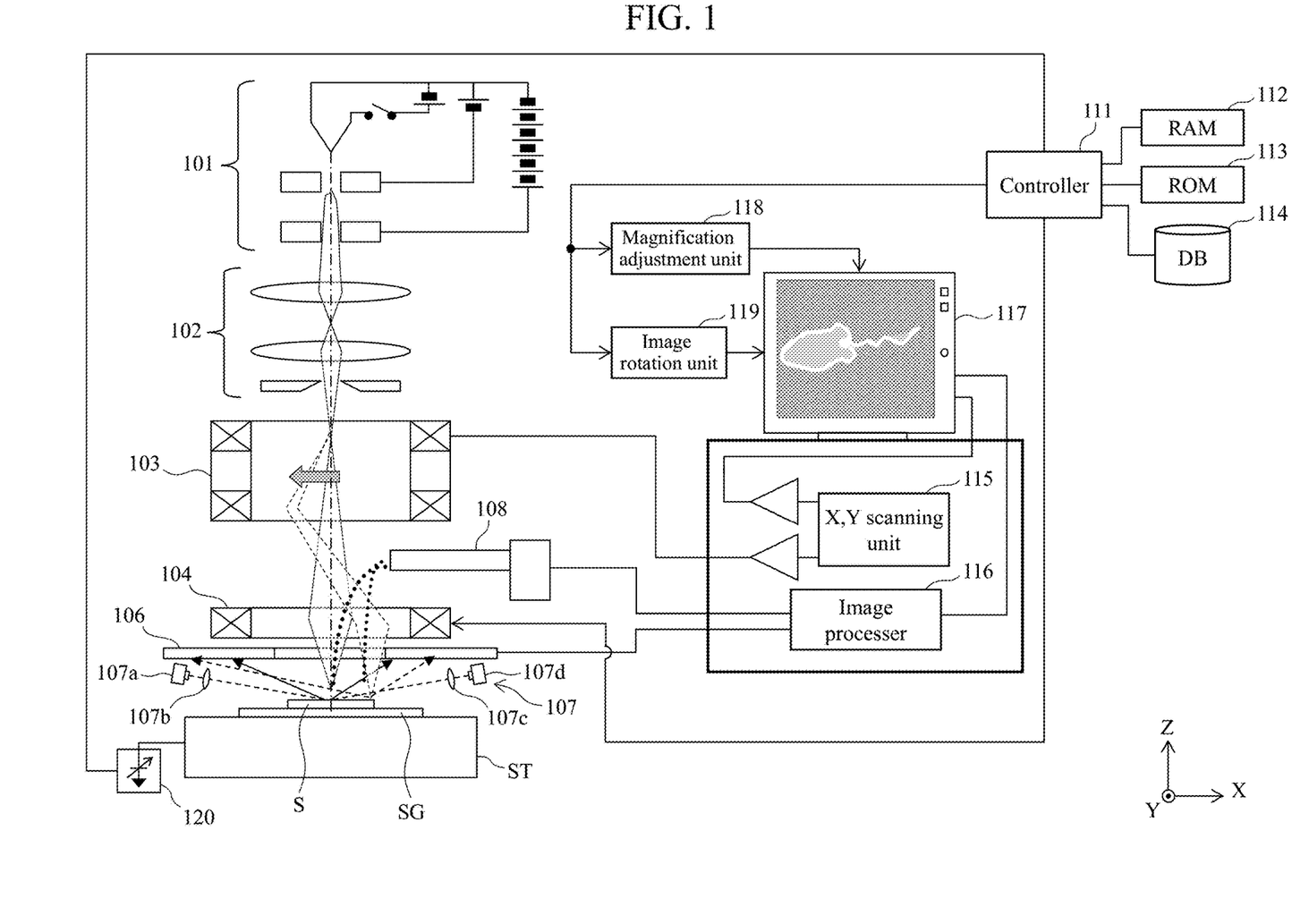
FIG. 1 is a schematic diagram of a scanning electron microscope (SEM) in accordance with a first embodiment.

First, a first embodiment of the present invention will be described. FIG. 1 illustrates a schematic diagram of a scanning electron microscope (SEM) in accordance with the first embodiment. The scanning electron microscope includes, for example, an electron gun 101, a condenser lens 102, a scanning coil 103, an objective lens 104, a primary electron detector 106, a stage ST, an object-plane position detector 107, and a secondary electron detector 108.

The electron gun 101 accelerates electrons at a predetermined accelerating voltage to generate an electron beam. The condenser lens 102 converges the electron beam to reduce the diameter of the electron beam. The scanning coil 103 has a function of performing electron beam scanning. The objective lens 104 is, when coil current $I_{obj}$ is applied thereto, focuses (i.e., converges) the electron beam and irradiates a sample S, which is placed on a glass slide SG on the stage ST, with the electron beam with a diameter of about several nm. The electron beam moves above the sample S with a voltage applied to the scanning coil 103.

The primary electron detector 106 is a detector that detects primary electrons (backscattered electrons) reflected from the sample S. In addition, the object-plane position detector 107 is a detector for detecting the height of the surface of the sample S in the Z-direction. The object-plane position detector 107 includes, for example, a light source 107a, an imaging lens 107b, a collector lens 107c, and a light-receiving element 107d. Determining the light-receiving state of the light-receiving element 107d can determine the position of the surface of the sample S in the Z-direction (i.e., the object-plane position $Z_s$).

The secondary electron detector 108 is a detector that detects secondary electrons generated from the sample S. Information on an image of the sample S is generated on the basis of output signals of the aforementioned primary electron detector 106 and secondary electron detector 108.

In addition, the scanning electron microscope includes a controller 111, RAM 112, ROM 113, a database 114, an XY scanning unit 115, an image processor 116, a display 117, a magnification adjustment unit 118, an image rotating unit 119, and a retarding voltage controller 120.

The controller 111 controls the operation of the entire scanning electron microscope by controlling various voltages and currents in the scanning electron microscope. Each of the RAM 112 and the ROM 113 has a function of storing programs and data used for the control operation. The database 114 stores information on the hysteresis characteristics of the objective lens 104 as described below.

The XY scanning unit 115 performs electron beam scanning in the XY direction in accordance with the dimensions of a region to be scanned and the scanning speed. In addition, the image processor 116 executes image processing in accordance with output signals of the primary electron detector 106 and/or the secondary electron detector 108, thereby generating image data to be displayed on the display 117. In accordance with the image data (i.e., signals) generated through the processing of signals from the detectors 106, 108 by the image processor 116, the display 117 displays the image on the display screen. The magnification adjustment unit 118 adjusts the magnification of the image data generated by the image processor 116 in accordance with control signals from the controller 111. In addition, the image rotating unit 119 rotates the image data generated by the image processor 116 in accordance with control signals from the controller 111.

The retarding voltage controller 120 controls a retarding voltage $V_r$ to be applied to the stage ST in accordance with control signals from the controller 111. The retarding voltage $V_r$ is a negative voltage applied to or around the sample S, and decelerates an electron beam, which has been accelerated by the electron gun 101, immediately in front of the sample S. With the decelerated electron beam, the focal position of the electron beam on the sample S can be adjusted. It should be noted that when the retarding voltage $V_r$ is applied, distortion of an electric field may occur, which in turn can change the magnification or the angle of the resulting SEM image.

Figure 2:
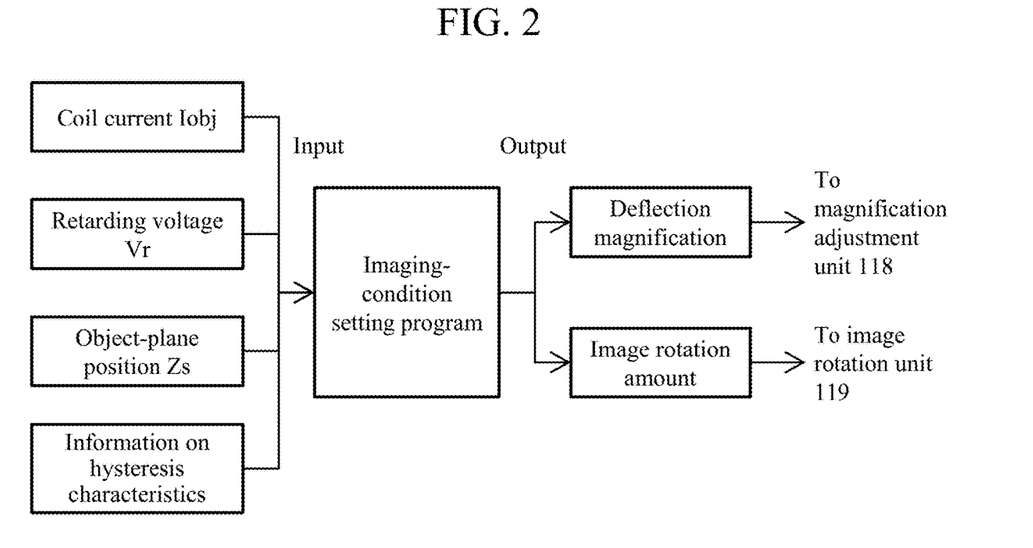
FIG. 2 is a block diagram illustrating a program for setting the imaging conditions for the scanning electron microscope (SEM) in accordance with the first embodiment.

Control programs stored in the ROM 113 include an imaging-condition setting program for setting the imaging conditions for the sample S. The imaging-condition setting program calculates, as illustrated in FIG. 2, the deflection magnification and the image rotation amount on the basis of information on the coil current $I_{obj}$, information on the retarding voltage $V_r$, information on the object-plane position $Z_s$, and information on the hysteresis characteristics stored in the RAM 112 or the ROM 113, and supplies the calculated deflection magnification and image rotation amount to the magnification adjustment unit 118 and the image rotating unit 119, respectively. The details of the information on the hysteresis characteristics are described below. It should be noted that the information input to the imaging-condition setting program as factors for setting the imaging conditions are not limited to the aforementioned information, and another information may be input instead of or in addition to the aforementioned information.

The objective lens 104 includes a coil and a magnetic circuit made of a ferromagnetic material such as iron. When current is applied to the coil on the basis of the height of the sample measured by the object-plane position detector 107, a magnetic field is generated on the optical axis. At this time, the ferromagnetic material has hysteresis characteristics. Accordingly, if the ferromagnetic material has been magnetized, the magnetic flux density $B_{obj}$ on the optical axis changes depending on the amount of magnetization, and thus cannot be uniquely determined, even when the current is set to a given value $I_{ogj}$.

Figure 3:
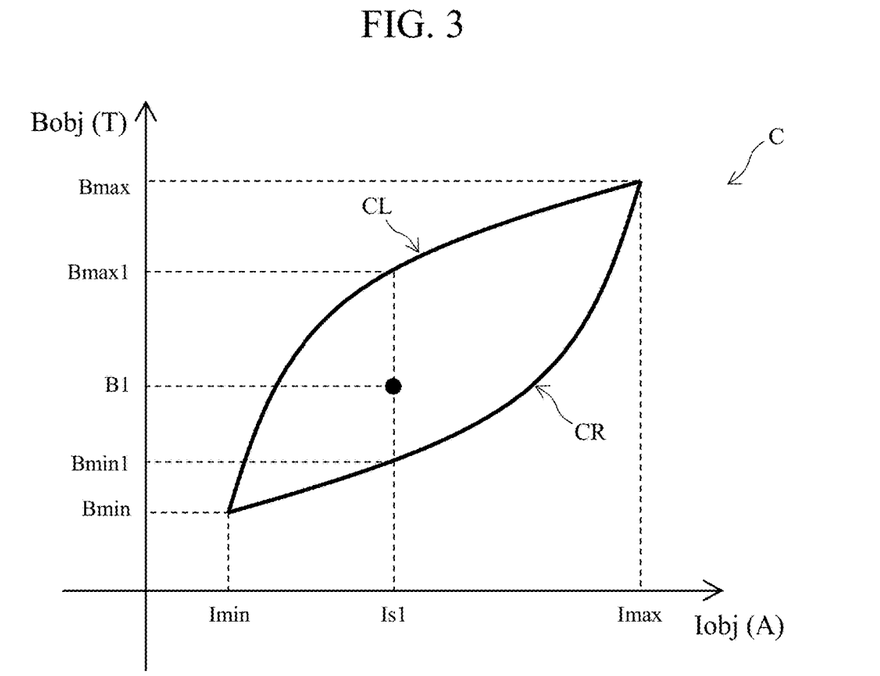
FIG. 3 is a graph illustrating the hysteresis characteristics of an objective lens 104.

The hysteresis characteristics of the objective lens 104 will be described with reference to FIG. 3. Assume that the maximum value and the minimum value of the coil current $I_{obj}$ applied to the coil of the objective lens 104 are $I_{max}$ and $I_{min}$, respectively. In addition, assume that the maximum value and the minimum value of the magnetic flux density $B_{obj}$ of magnetism generated around the objective lens 104 due to the coil current $I_{obj}$ are $B_{max}$ and $B_{min}$, respectively.

In a state in which the magnetism of the magnetic circuit made of the ferromagnetic material is removed (i.e., when the magnetic circuit is in a demagnetized state), the relationship between the coil current $I_{obj}$ and the magnetic flux density $B_{obj}$ is defined by an upward curve CR. That is, when the magnetic circuit is not magnetized (i.e., is demagnetized), the magnetic flux density $B_{obj}$ is uniquely determined once the coil current $I_{obj}$ is determined. Usually, in a scanning electron microscope, the upward curve CR is determined in advance, and the value of the magnetic flux density $B_{obj}$ is calculated (i.e., estimated) with reference to the data on the upward curve CR.

Meanwhile, when the coil current $I_{obj}$ is increased to the maximum value $I_{max}$ and is then reduced again toward the minimum value $I_{min}$, the relationship between the coil current $I_{obj}$ and the magnetic flux density $B_{obj}$ changes along a downward curve CL, for example. When the coil current $I_{obj}$ has changed through various histories between the maximum value $I_{max}$ and the minimum value $I_{min}$, the relationship between the coil current $I_{obj}$ and the magnetic flux density $B_{obj}$ is within the range of a closed curve C surrounded by the downward curve CL and the upward curve CR. That is, when the magnetic circuit of the objective lens 104 is magnetized, the relationship between the coil current $I_{obj}$ and the magnetic flux density $B_{obj}$ cannot be uniquely determined. For example, even when the value of the coil current $I_{obj}$ is determined as $I_{s1}$ in a state in which the magnetic circuit is magnetized, it is only found that the value $B_1$ of the magnetic flux density $B_{obj}$ (see FIG. 3) is between the maximum value $B_{max1}$ and the minimum value $B_{min1}$, and thus, the value of the magnetic flux density $B_{obj}$ cannot be estimated.

Unless the relationship between the coil current $I_{obj}$ and the magnetic flux density $B_{obj}$ is uniquely determined, it would be necessary to adjust the retarding voltage $V_r$. However, in such a case, the deflection magnification and the image rotation amount computed using the coil current $I_{obj}$ as an input would involve errors, and thus, the reproducibility of images or values of measured lengths would deteriorate.

Figure 4:
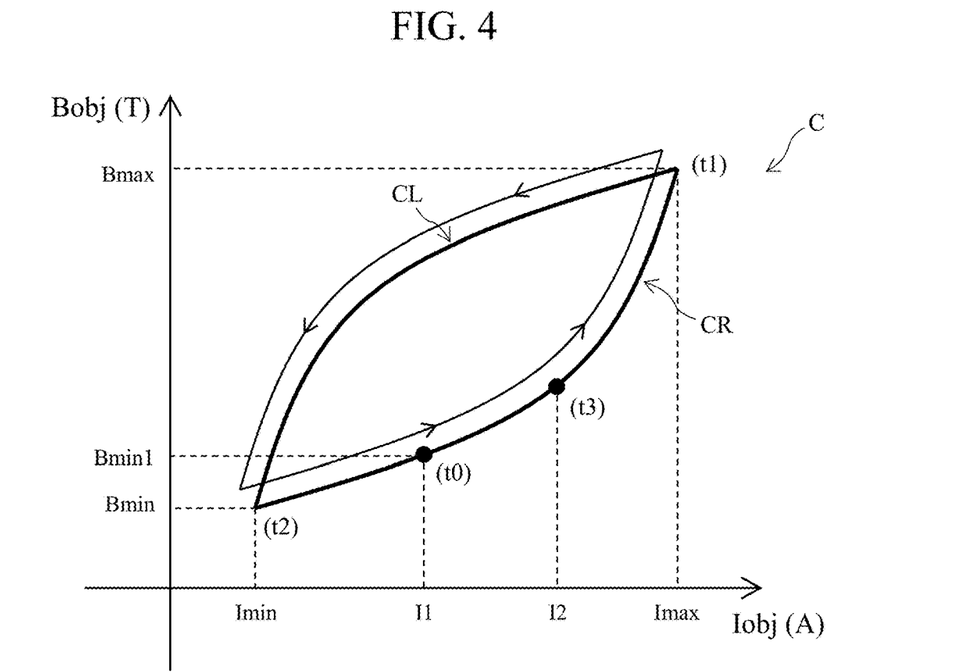
FIG. 4 is a schematic diagram illustrating a specific example of a lens reset operation.
Figure 5:
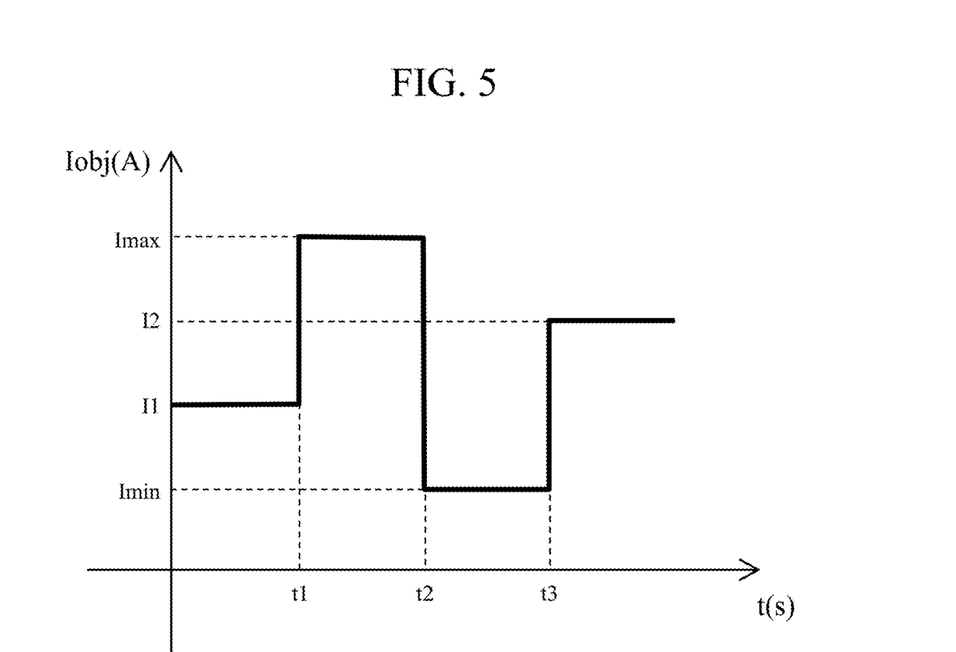
FIG. 5 is a graph illustrating a specific example of a lens reset operation.

Therefore, in the conventional scanning electron microscope, an operation called a lens reset operation is executed when the amount of variation of the coil current $I_{obj}$ becomes greater than or equal to a given value. As described previously, the lens reset operation is an operation of demagnetizing the magnetic circuit of the objective lens by once reducing the coil current of the objective lens to the minimum value and then increasing the coil current again. A specific example of the lens reset operation will be described with reference to FIGS. 4 and 5. FIG. 4 is a graph illustrating changes in the coil current $I_{obj}$ and the magnetic flux density $B_{obj}$ during the lens reset operation, and FIG. 5 is a graph illustrating changes in the coil current $I_{obj}$ with time.

When the value of the coil current $I_{obj}$ is $I_1$ at time $t_0$ and is thereafter changed to a target value $I_2$ that is greater than $I_1$ by a predetermined value or more, a lens reset operation is executed for demagnetizing the magnetic circuit. In the lens reset operation, first, the coil current $I_{obj}$ is increased to the maximum value $I_{max}$ at time $t_1$ and is then reduced to the minimum value $I_{min}$ at time $t_2$ after a predetermined time has elapsed. Then, at time $t_3$, the coil current $I_{obj}$ is increased to the target value $I_2$. In this manner, as the coil current $I_{obj}$ is increased to the maximum value $I_{max}$ and is then reduced to the minimum value $I_{obj}$ the magnetic circuit of the objective lens 104 is demagnetized. After the magnetic circuit is demagnetized, the relationship between the coil current $I_{obj}$ and the magnetic flux density $B_{obj}$ is again defined by the upward curve CR. Therefore, once the coil current $I_{obj}$ is determined, the magnetic flux density $B_{obj}$ is uniquely determined.

However, since the lens reset operation involves a significant change in the amount of current, the wait time for a response of a magnetic field is long (for example, several ten seconds), and thus, the throughput decreases. Therefore, in this embodiment, the influence of hysteresis is removed without using the lens reset operation. In this embodiment, for the scanning electron microscope that adjusts the retarding voltage $V_r$ for adjusting the focal position, a correspondence table (i.e., information on the hysteresis characteristics) indicating the relationship among the coil current $I_{obj}$, the amount of variation $\Delta I_{obj}$ of the coil current, the amount of variation $\Delta V_{hys}$ of the retarding voltage $V_r$, and the amount of variation $\Delta B_{hys}$ of the magnetic flux density $B_{obj}$ is acquired in advance, and the correspondence table is stored in the database 114. The aforementioned deflection magnification and image rotation amount are corrected with reference to the correspondence table.

Figure 6:
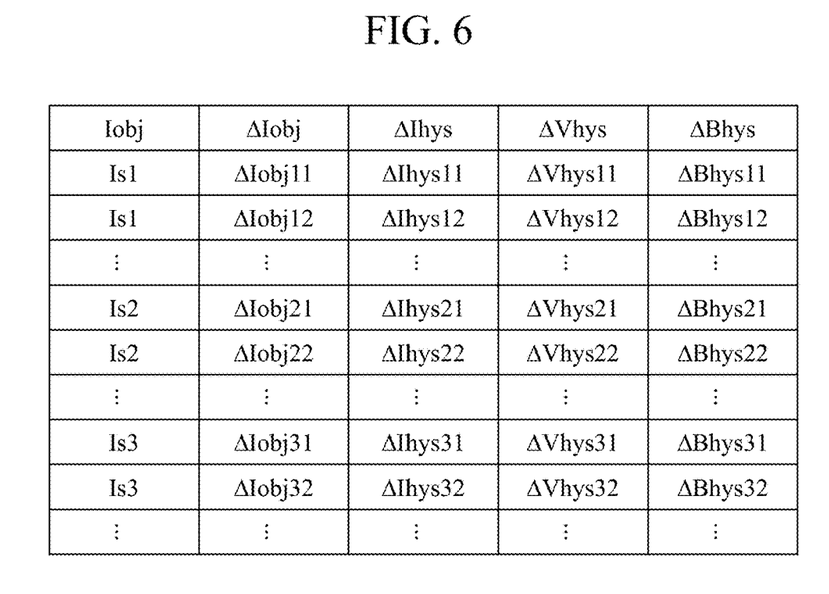
FIG. 6 is an example of a correspondence table stored in a database 114.

FIG. 6 illustrates an example of the correspondence table stored in the database 114. In the correspondence table, pieces of data arranged in the horizontal direction indicate a set of data. In the correspondence table, for example, (1) the value of the coil current $I_{obj}$, (2) the amount of variation $\Delta I_{obj}$ of the coil current $T_{obj}$, (3) the amount of variation $\Delta V_{hys}$ of the retarding voltage $V_r$ when the value of the coil current $I_{obj}$ and the amount of variation $\Delta I_{obj}$ thereof are provided, (4) the amount of variation $\Delta B_{hys}$ of the magnetic flux density $B_{obj}$, and (5) the amount of variation $\Delta I_{hys}$ of the coil current $I_{obj}$ used to calculate the amount of variation $\Delta B_{hys}$ are provided as a set of data. The types of data in the set of data are only exemplary, and therefore, the types of data are not limited thereto. It is acceptable as long as the correspondence table includes information on the relationship between the amount of variation $\Delta I_{obj}$ of the coil current $I_{obj}$ and the amount of variation $\Delta B_{obj}$ of the magnetic flux density $B_{obj}$.

Figure 7:
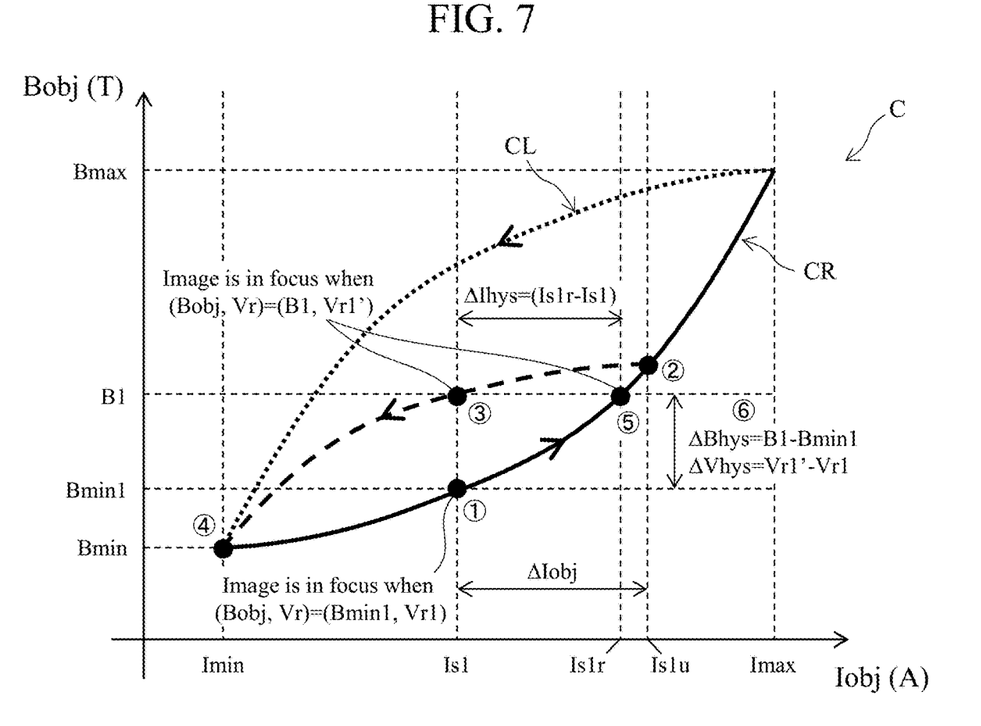
FIG. 7 is a schematic diagram illustrating an operation for acquiring the correspondence table.

Such a correspondence table can be acquired by performing the operation illustrated in FIG. 7, for example. It should be noted that encircled numbers 1 to 6 in FIG. 7 indicate the procedures (steps 1 to 6) of the operation of acquiring the correspondence table. It should be noted that the operation of acquiring data on the correspondence table is performed as the controller 111 executes a program for acquiring information on the hysteresis characteristics stored in the RAM 112 or ROM 113. That is, the controller 111 functions as a hysteresis information acquiring unit.

First, after a usual lens reset operation is performed once through the procedures illustrated in FIGS. 4 and 5, the value of the coil current $I_{obj}$ is set to the initial value $I_{s1}$ (step 1), and the retarding voltage $V_r$ is adjusted. While the focus of a SEM image is being checked, the value $V_{r1}$ of the retarding voltage $V_r$ when the SEM image is in focus is determined. At this time point, since the magnetic circuit of the objective lens 104 has been demagnetized through the lens reset operation, the magnetic flux density $B_{obj}=B_{min1}$ can be determined on the basis of the acquired data on the upward curve CR. In this manner, in a state in which the magnetic circuit is demagnetized, the relationship between the magnetic flux density $B_{obj}$ and the retarding voltage $V_r$ when the coil current $I_{obj}$ is set to $I_{s1}$ is determined as $(B_{obj}, V_r) = (B_{min1}, V_{r1})$.

Next, the value of the coil current $I_{obj}$ is changed to a value $I_{s1u}$ that is greater than $I_{s1}$ by a difference $\Delta I_{obj}$ (step 2), and then, the coil current $I_{obj}$ is returned to the initial value $I_{s1}$ again, so that the retarding voltage $V_r$ is adjusted and the value of $V_{r1}'$ of the retarding voltage $V_r$ when a SEM image is in focus is determined (step 3). Since the influence of the hysteresis characteristics appears at this time point, the value $B_1$ of the magnetic flux density $B_{obj}$ in step 3 cannot be identified from the acquired data on the upward curve CR, and thus is unclear at the time point of step 3.

Next, the value of the retarding voltage $V_r$ is maintained at the value $V_{r1}'$ of step 3, and the coil current $I_{obj}$ is once reduced to the minimum value $I_{min}$ (step 4). At this time, due to the influence of the retarding voltage $V_r$ maintained at $V_{r1}'$, the obtained SEM image is in a defocused state (i.e., an out-of-focus state). In step 4, the magnetic circuit of the objective lens 104 is demagnetized again.

In step 4, the coil current $I_{obj}$ is again increased along the upward curve CR in FIG. 7 while the value of the retarding voltage $V_r$ is maintained at $V_{r1}'$. At this time, since the retarding voltage $V_r = V_{r1}'$, the obtained SEM image is in an out-of-focus state. However, as the coil current $I_{obj}$ increases, the SEM image gradually becomes closer to an in-focus state (i.e., a focused state). Then, when the magnetic flux density $B_{obj}$ becomes equal to the aforementioned unknown value $B_1$ (step 5), the SEM image becomes in focus. The value $I_{s1r}$ of the coil current $I_{obj}$ at this time is identified (the amount of variation $\Delta I_{hys} = I_{s1r} - I_{s1}$ is also identified), and further, the value of the unknown value $B_1$ is also identified at this time point on the basis of the information on the known upward curve CR.

In the aforementioned manner, the amount of variation $\Delta B_s$ of the magnetic flux density $B_{obj}$ from the initial value $B_{min1}$ ($=B_1-B_{min1}$) when the coil current $I_{obj}$ is changed (i.e., increased) from the initial value $I_{s1}$ by $\Delta I_{obj}$ and is again returned to the initial value $I_{s1}$, is determined. In addition, the amount of variation $\Delta V_{hys}$ of the retarding voltage $V_r$ ($=V_{r1}'-V_{r1}$) is also determined (step 6). In this manner, the value (i.e., initial value) of the coil current $I_{obj}$, the amount of variation $\Delta I_{obj}$ of the coil current $I_{obj}$ from the value (i.e., initial value) of the coil current $I_{obj}$, the amount of variation $\Delta V_{hys}$ of the retarding voltage $V_r$ when the amount of variation $\Delta I_{obj}$ is provided, and the amount of variation $\Delta B_{hys}$ of the magnetic flux density $B_{obj}$ are provided as a set of data, and are stored in the database 114 as data that forms the correspondence table.

Figure 8:
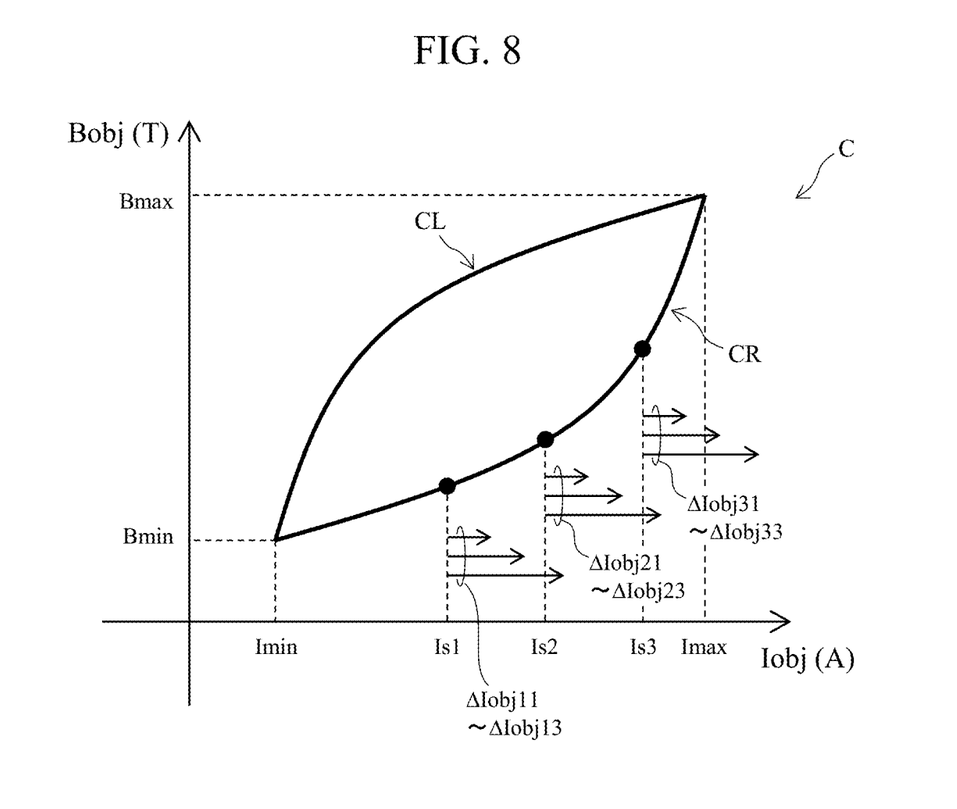
FIG. 8 is a schematic diagram illustrating an operation for acquiring the correspondence table.

Through the aforementioned operations, (steps 1 to 6), the initial value of the coil current $I_{obj}$ and the amount of variation $\Delta I_{obj}$ thereof are changed to various values so as to acquire a plurality of combinations of the value (i.e., initial value) of $I_{obj}$, the amount of variation $\Delta I_{obj}$, the amount of variation $\Delta V_{hys}$, and the amount of variation $\Delta B_{hys}$. Such plurality of combinations of data form the aforementioned correspondence table. At this time, it is preferable to obtain data by changing the value of the coil current $I_{obj}$ to various values between the minimum value $I_{min}$ and the maximum value $I_{max}$ at predetermined intervals as illustrated in FIG. 8, and further change the amount of variation $\Delta I_{obj}$ to various values (for example, three ways including $I_{obj11}$, $I_{obj12}$, and $I_{obj13}$) for each value of the coil current $I_{obj}$.

Once such a correspondence table (i.e., information on the hysteresis characteristics) is obtained, it becomes possible to estimate changes in the magnetic flux density due to the hysteresis characteristics with reference to the table without repeating lens reset operations, and perform image processing accordingly. Specifically, when information on the value related to the coil current $I_{obj}$ ($I_{s1}$, $\Delta I_{obj}$), the value related to the retarding voltage $V_r$ ($V_{r1}$, $V_{r1'}$)), and the object-plane position $Z_s$ of the sample S are provided as input information for the imaging-condition setting program in FIG. 2, the imaging-condition setting program refers to the information on the hysteresis characteristics stored in the database 114, and estimates the amount of variation $\Delta B_{obj}$ of the magnetic flux density $B_{obj}$ corresponding to the input value (that is, the controller 111 functions as an estimation unit that estimates the amount of variation $\Delta B_{obj}$). On the basis of the estimated value, the imaging-condition setting program calculates the deflection magnification and the image rotation amount, which are then transmitted to the magnification adjustment unit 118 and the image rotating unit 119, respectively. Accordingly, lens reset operations can be omitted or the number of lens reset operations can be reduced.

It should be noted that the information on the hysteresis characteristics stored in the database 114 is not limited to the correspondence table such as the one illustrated in FIG. 6. For example, it is also possible to store a multivariable function that uses $I_{obj}$, $\Delta I_{obj}$, and the amount of variation $\Delta V_{hys}$ of the retarding voltage $V_r$ as variables, and estimate (i.e., calculate) the amount of variation $\Delta B_{obj}$ of the magnetic flux density on the basis of the function. When the correspondence table such as the one illustrated in FIG. 6 is used, linear interpolation, polynomial approximation, Akima's interpolation, and the like can be used for the interpolation of data. Although estimation of changes in the magnetic field due to hysteresis has been described so far, estimation can be similarly performed even when changes in the magnetic field due to the non-linear properties of the magnetic properties are included (for example, when magnetic excitation is performed up to a level of around the magnetic saturation).

It is needless to mention that the method for acquiring the correspondence table such as the one illustrated in FIG. 6 or information on the hysteresis characteristics in other forms is not limited to the method illustrated in FIG. 7. Although the acquisition method described with reference to FIG. 7 is obtained by actually increasing or reducing the coil current $I_{obj}$, a similar correspondence table can also be acquired by performing computer simulation instead of actually applying the coil current $I_{obj}$.

Figure 9:
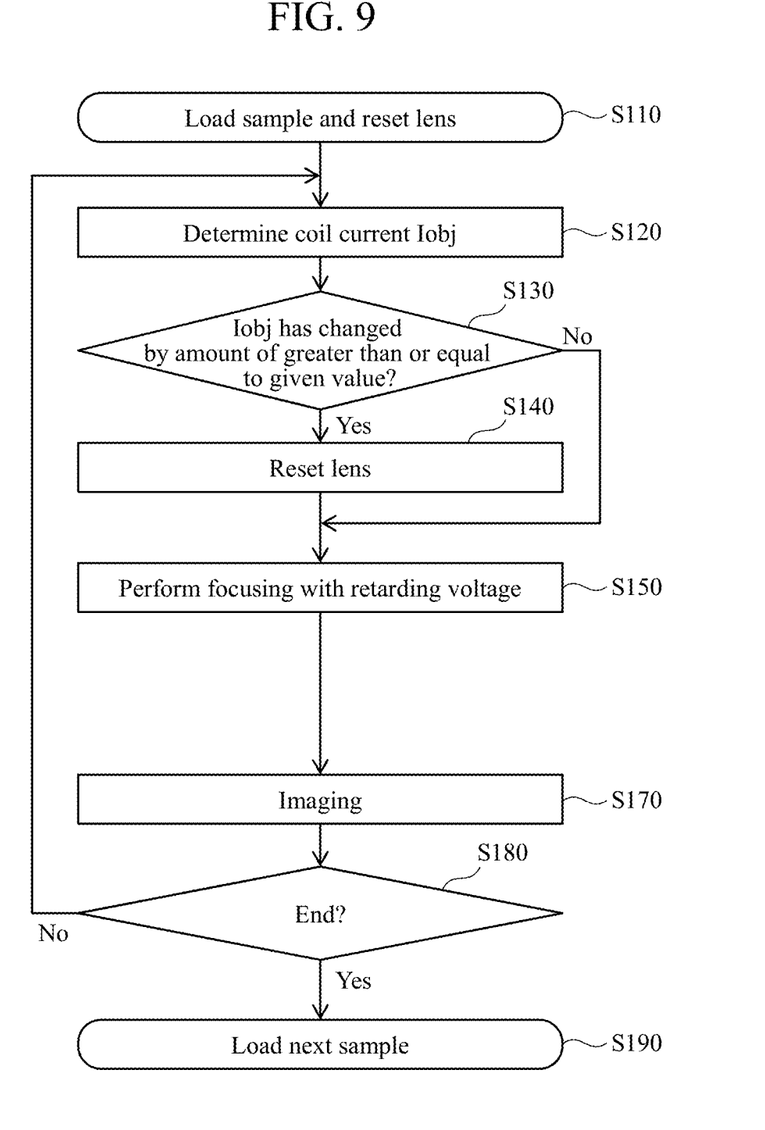
FIG. 9 is a flowchart illustrating the operation of a conventional scanning electron microscope (SEM)

Next, the operation of the scanning electron microscope of the first embodiment will be described with reference to FIG. 10 through comparison with the operation of the conventional scanning electron microscope (FIG. 9).

As illustrated in FIG. 9, in the conventional scanning electron microscope, first, after a sample S is placed (loaded) on the stage ST, a lens reset operation such as the one illustrated in FIGS. 4 and 5 is performed (step S110).

After that, the value of the coil current $I_{obj}$ to be applied to the objective lens 104 is determined on the basis of the height of the sample S (step S120). At this time, depending on the history of variation of the coil current $I_{obj}$, the relationship between the coil current $I_{obj}$ and the magnetic flux density $B_{obj}$ may deviate from the known upward curve CR due to the hysteresis characteristics, and in such a case, it is impossible to determine how large the deviation is.

Therefore, in the conventional scanning electron microscope, it is determined if the coil current $I_{obj}$ has changed by an amount greater than or equal to a given value (step S130), and if the coil current $I_{obj}$ has changed by an amount of greater than or equal to a given value, a lens reset operation is performed (step S140), so that focusing is executed with the retarding voltage $V_r$ with the minimized influence of the hysteresis characteristics and imaging is executed (steps S150 and S170). If a next sample S is present, the sample S is loaded and similar imaging is repeated (steps S180 and S190). In this manner, in the conventional scanning electron microscope, the number of lens reset operations executed is large, and thus, the throughput is low.

Meanwhile, in the scanning electron microscope of the first embodiment, a correspondence table is created in advance through the aforementioned procedures and is stored in the database 114 (step S200). In the imaging operation performed after the correspondence table is stored, a sample S is loaded and a lens reset operation is performed so that the coil current $I_{obj}$ is determined (steps S210 and S220). Even if the amount of variation $\Delta I_{obj}$ of the coil current $I_{obj}$ is greater than or equal to a predetermined value, a lens reset operation is not performed under only such condition in the first embodiment, and focusing is performed through adjustment of the retarding voltage $V_r$ (step S250).

After that, in accordance with the determined coil current $I_{obj}$, the amount of variation $\Delta I_{obj}$, the amount of variation $\Delta V_{hrs}$ of the retarding voltage $V_r$ (that is, the adjusted amount of the focal position), and the object-plane position $Z_s$, the correspondence table in the database 114 is referred to as the information on the hysteresis characteristics. On the basis of the results of the reference, the amount of variation $\Delta B_{obj}$ of the magnetic flux density $B_{obj}$ is determined, and accordingly, the imaging conditions (i.e., the deflection magnification and the image rotation amount) are calculated and are transmitted to the magnification adjustment unit 118 and the image rotating unit 119, respectively, so that the SEM image is corrected (step S260) and imaging is performed (step S270). As described above, according to this embodiment, lens reset operations can be omitted except for immediately after the sample S is loaded, and therefore, the throughput can be improved.

It should be noted that in step S260, the value of the retarding voltage $V_r$ used when estimating variation of the magnetic field due to the hysteresis characteristics is preferably a value from which a value corresponding to electrostatic charges on the sample S has been subtracted. Electrostatic charges on the sample S may be measured using an instrument for measuring electrostatic charges. Or it may be measured from a voltage value when focusing was executed by changing the retarding voltage $V_r$ immediately after a lens reset operation is performed, that is, when no influence of hysteresis is present.

Second Embodiment

Figure 11:
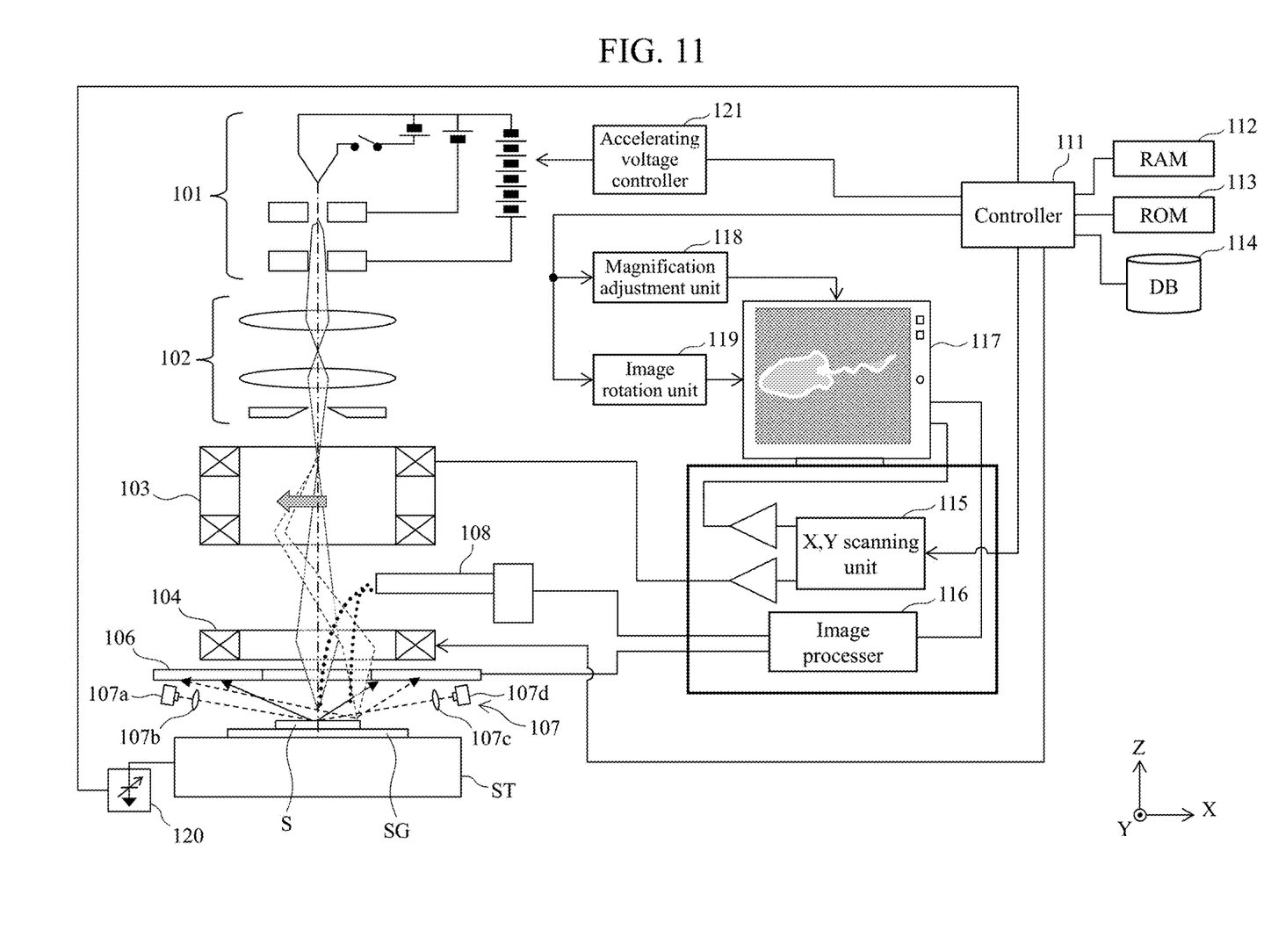
FIG. 11 is a schematic diagram of a scanning electron microscope (SEM) in accordance with a second embodiment.

Next, the second embodiment of the present invention will be described. FIG. 11 is a schematic diagram of a scanning electron microscope (SEM) in accordance with the second embodiment. In FIG. 11, the same elements as those in the first embodiment are denoted by the same reference numerals as those in FIG. 1. Therefore, the detailed description thereof will be omitted and only the differences will be described.

The scanning electron microscope of the first embodiment includes the retarding voltage controller 120 that adjusts the value of the retarding voltage $V_r$ to be applied to the sample S, as a device for adjusting the focal position. The scanning electron microscope of the second embodiment includes, instead of (or in addition to) the retarding voltage controller 120, an accelerating voltage controller 121 that adjusts the accelerating voltage for the electron gun 101. Adjusting the accelerating voltage with the accelerating voltage controller 121 can adjust the focal position of an electron beam.

In the correspondence table stored in the database 114 of the second embodiment, the amount of variation $\Delta V_{achys}$ of the accelerating voltage can be included as the data instead of (or in addition to) the amount of variation $\Delta V_{hys}$ of the retarding voltage $V_r$.

The operation in the second embodiment will be described. The entire operation is similar to that in the first embodiment (FIG. 10). However, instead of (or in addition to) step S250 illustrated in FIG. 10, focusing is performed through the adjustment of the accelerating voltage for the electron gun 101.

Then, in step S260, the aforementioned correspondence table in the database 114 is referred to as the information on the hysteresis characteristics so that the deflection magnification and image rotation can be corrected as in the first embodiment. As the information to be input to the imaging-condition setting program (FIG. 2), information on the amount of variation of the accelerating voltage (that is, information on the adjusted amount of the focal position) is input instead of (or in addition to) the information on the retarding voltage $V_r$. Accordingly, as in the first embodiment, lens reset operations can be omitted or the number of lens reset operations can be reduced, and thus, the throughput can be improved.

Third Embodiment

Figure 12:
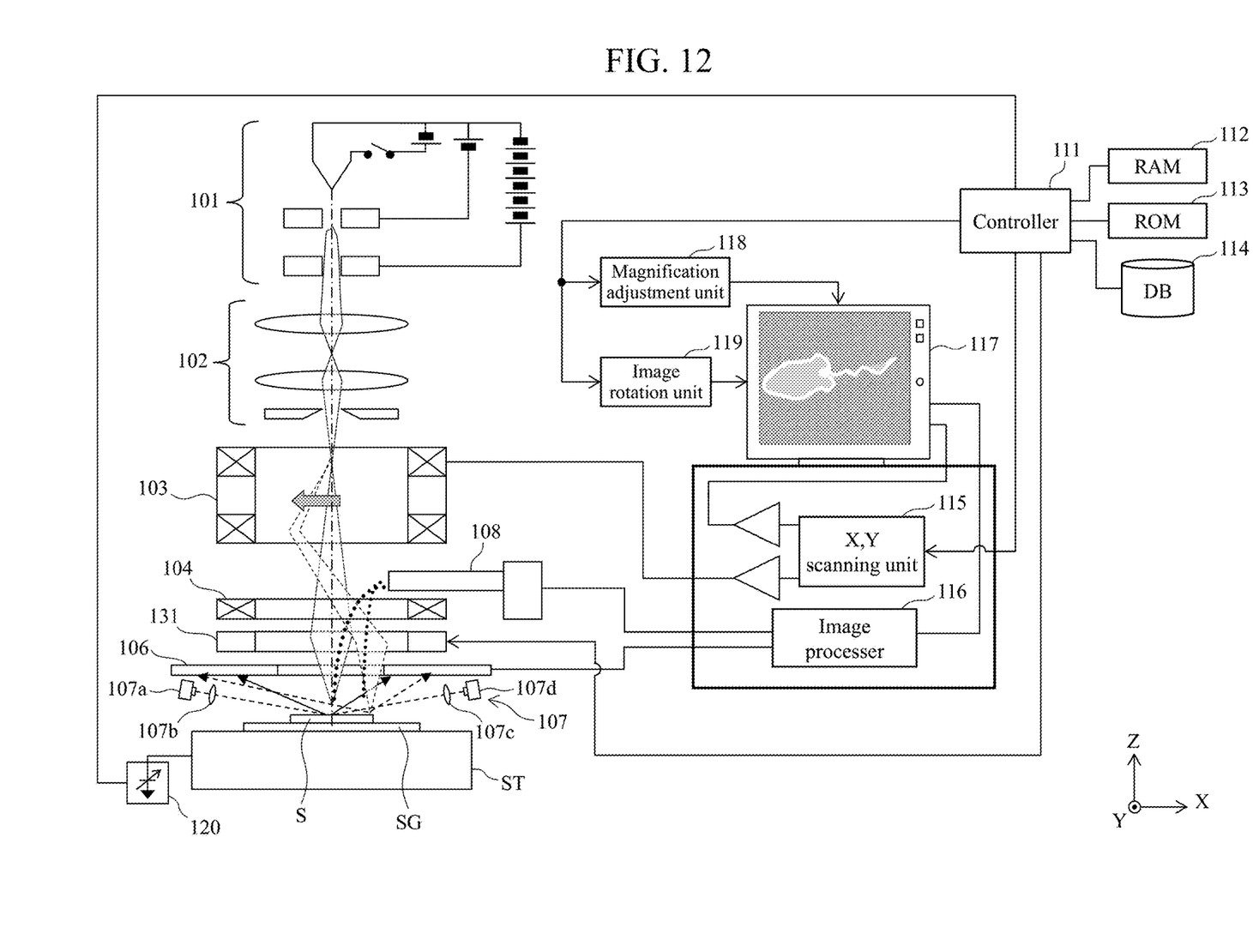
FIG. 12 is a schematic diagram of a scanning electron microscope (SEM) in accordance with a third embodiment.

Next, the third embodiment of the present invention will be described. FIG. 12 is a schematic diagram of a scanning electron microscope (SEM) in accordance with the third embodiment. In FIG. 12, the same elements as those in the first embodiment are denoted by the same reference numerals as those in FIG. 1. Therefore, the detailed description thereof will be omitted and only the differences will be described.

In the aforementioned embodiments, the retarding voltage $V_r$ or the accelerating voltage for the electron gun 101 is adjusted, that is, an electric field is adjusted so as to adjust the focal position of an electron beam. In the third embodiment, instead of (or in addition to) performing such adjustment, a magnetic field lens 131 that uses a non-magnetic material as a material of the magnetic circuit is separately provided so that the focal position is adjusted by the magnetic field lens 131. For such a magnetic field lens 131, a magnetic material is not used to generate a magnetic field for adjusting the focal position. Therefore, there is no influence of hysteresis as in a case where the focal position is adjusted with an electric field.

Figure 10:
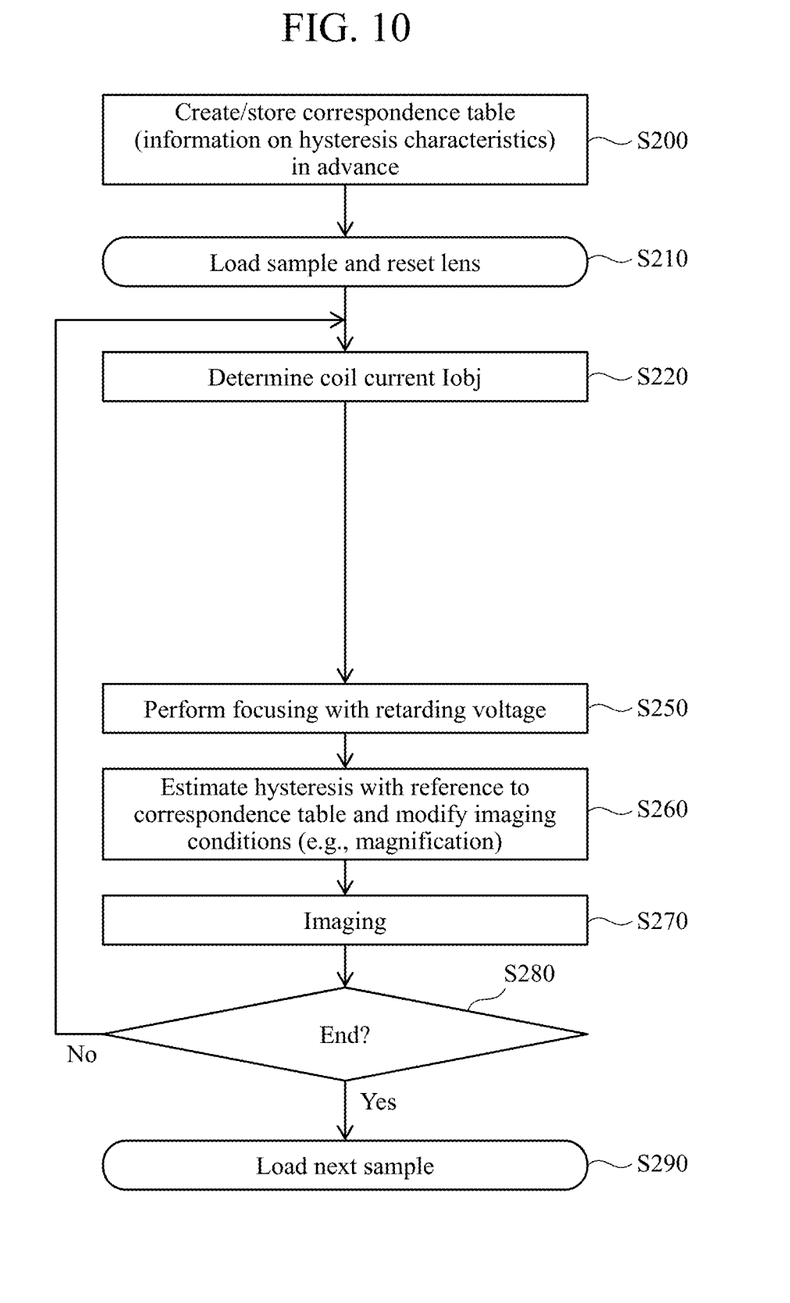
FIG. 10 is a flowchart illustrating the operation of the scanning electron microscope (SEM) in accordance with the first embodiment.

Specifically, in the flow of FIG. 10, focusing is performed through the adjustment of the voltage applied to the magnetic field lens 131 instead of (or in addition to) performing focusing with the retarding voltage $V_r$ in step S250. The correspondence relationship between the current (or voltage) applied to the magnetic field lens 131 herein and the coil current $I_{obj}$ of the objective lens 104 is determined in advance, and the correspondence relationship is stored as a correspondence table in the database 114 and is referred to during the imaging operation so that the deflection magnification and the image rotation can be corrected as in the aforementioned embodiments. As the information to be input to the imaging-condition setting program (FIG. 2), information on the current or voltage applied to the magnetic field lens 131 (that is, information on the adjusted amount of the focal position) is input instead of (or in addition to) the information on the retarding voltage $V_r$.

It should be noted that if a magnetic field generated by the magnetic field lens 131 interferes with the magnetic circuit of the objective lens 104, the influence of hysteresis would arise. Therefore, the magnetic field lens 131 and the objective lens 104 should be disposed with a sufficient distance secured therebetween.

Fourth Embodiment

Figure 13:
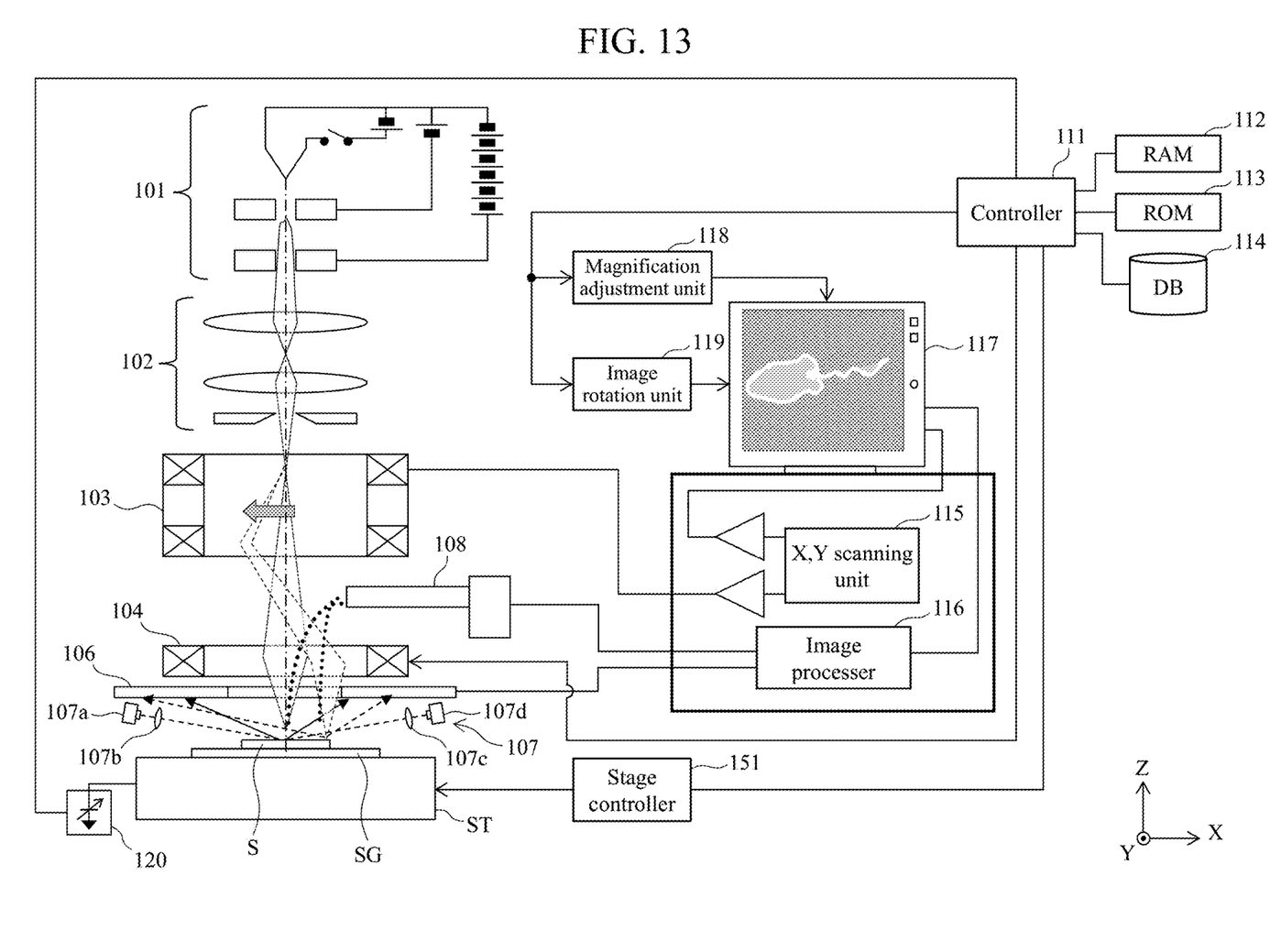
FIG. 13 is a schematic diagram of a scanning electron microscope (SEM) in accordance with a fourth embodiment.

Next, the fourth embodiment of the present invention will be described. FIG. 13 is a schematic diagram of a scanning electron microscope (SEM) in accordance with the fourth embodiment. In FIG. 13, the same elements as those in the first embodiment are denoted by the same reference numerals as those in FIG. 1. Therefore, the detailed description thereof will be omitted and only the differences will be described.

In the aforementioned embodiments, a method for adjusting the focal position of an electron beam using an electric field or a magnetic field is adopted. In the fourth embodiment, instead of (or in addition to) adjusting the focal position of an electron beam using an electric field or a magnetic field, the height of the sample S in the Z-direction (i.e., the height of the stage ST) is adjusted by the stage controller 151 so that the focal position of an electron beam is (relatively) adjusted.

Specifically, in the flow of FIG. 10, the height of the sample S in the Z-direction is adjusted by controlling the stage controller 151 instead of (or in addition to) performing focusing with the retarding voltage $V_r$ in step S250. The relationship between the adjusted amount of the height of the sample S herein and the coil current $I_{obj}$ of the objective lens 104 is acquired as a correspondence table in advance, and the table is referred to during the imaging operation so that the deflection magnification and image rotation can be corrected as in the aforementioned embodiments. As the information to be input to the imaging-condition setting program (FIG. 2), information on the amount of control performed by the stage controller 151 (that is, information on the adjusted amount of the focal position) is input instead of (or in addition to) the retarding voltage $V_r$.

Although several embodiments of the present invention have been described, such embodiments are only exemplary and are not intended to limit the scope of the invention. Such embodiments can be implemented in various other forms, and can be omitted, replaced, or modified in various ways within the spirit and scope of the invention. Such embodiments or variations thereof are included in the spirit and scope of the invention and are included in the invention recited in the appended claims as well as equivalents thereof.

DESCRIPTION OF SYMBOLS

101 Electron gun
102 Condenser lens
103 Scanning coil
104 Objective lens
106 Primary electron detector
107 Object-plane position detector
108 Secondary electron detector
111 Controller
112 RAM
113 ROM
114 Database
115 XY scanning unit
116 Image processor
117 Display
118 Magnification adjustment unit
119 Image rotating unit
120 Retarding voltage controller
121 Accelerating voltage controller
131 Magnetic field lens
151 Stage controller
S Sample
ST Stage

What is claimed is:

1. A charged particle beam apparatus comprising:
an electron source configured to generate an electron beam;
an objective lens to which coil current is adapted to be applied to converge the electron beam on a sample;
a focal position adjustment device configured to adjust a focal position of the electron beam;
a detector configured to detect electrons from the sample;
a display unit configured to display an image of the sample in accordance with a signal from the detector;
a storage unit configured to store information on hysteresis characteristics of the objective lens; and
an estimation unit configured to estimate a magnetic field generated by the objective lens on the basis of the coil current, an amount adjustment of the focal position by the focal position adjustment device, and the information on the hysteresis characteristics.

2. The charged particle beam apparatus according to claim 1, further comprising a magnification correction unit configured to correct a deflection magnification of a captured image in accordance with the magnetic field estimated by the estimation unit.

3. The charged particle beam apparatus according to claim 1, wherein rotation of a captured image is corrected in accordance with the magnetic field estimated by the estimation unit.

4. The charged particle beam apparatus according to claim 1, wherein the information on the hysteresis characteristics includes information on a relationship between an amount of variation of the coil current and an amount of variation of a magnetic flux density.

5. The charged particle beam apparatus according to claim 1, wherein the focal position adjustment device is configured to adjust the focal position by applying a retarding voltage.

6. The charged particle beam apparatus according to claim 5, further comprising a hysteresis characteristic information acquisition unit configured to acquire information on the hysteresis characteristics,
wherein:
the hysteresis characteristic information acquisition unit is configured to execute
a first step of setting the coil current to an initial value and increasing the coil current by a first variation amount and then returning the coil current again to the initial value, and further adjusting the retarding voltage up to a first voltage at which an in-focus state of the image is obtained, a second step of reducing the coil current to a minimum value while maintaining the retarding voltage at the first voltage, and then increasing the coil current until an in-focus state of the image is obtained, and a third step of computing the information on the hysteresis characteristics on the basis of a value of the coil current when the in-focus state was obtained in the second step.

7. The charged particle beam apparatus according to claim 1, wherein the focal position adjustment device is a device configured to adjust the focal position of the electron beam by adjusting a voltage of the electron source.

8. The charged particle beam apparatus according to claim 1, wherein the focal position adjustment device includes a lens that uses a non-magnetic material as a material of a magnetic circuit.

9. The charged particle beam apparatus according to claim 1, wherein the focal position adjustment device is a stage controller configured to adjust a position of a stage on which the sample is placed.

10. A method for adjusting imaging conditions for a charged particle beam apparatus, the apparatus including an electron source configured to generate an electron beam, and an objective lens to which coil current is adapted to be applied to converge the electron beam on a sample, the method comprising:

acquiring information on hysteresis characteristics of the objective lens;

executing a lens reset operation in which a magnetic circuit of the objective lens is demagnetized;

determining the coil current;

adjusting a focal position of an electron beam using a focal position adjustment device;

estimating a magnetic field generated by the objective lens on the basis of the coil current, an amount of variation of the coil current, the amount of adjustment of the focal position, and the information on the hysteresis characteristics; and adjusting imaging conditions in accordance with the estimated magnetic field.

11. The method according to claim 10, further comprising correcting a deflection magnification of a captured image in accordance with the estimated magnetic field.

12. The method according to claim 10, further comprising correcting rotation of a captured image in accordance with the estimated magnetic field.

13. The method according to claim 10, wherein the information on the hysteresis characteristics includes information on a relationship between the amount of variation of the coil current and an amount of variation of a magnetic flux density.

14. The method according to claim 10, wherein the adjusting the focal position includes adjusting the focal position by applying a retarding voltage.

15. The method according to claim 14, wherein the acquiring the information on the hysteresis characteristics includes a first step of setting the coil current to an initial value and increasing the coil current by a first variation amount and then returning the coil current again to the initial value, and further adjusting a retarding voltage up to a first voltage at which an in-focus state of the image is obtained, a second step of reducing the coil current to a minimum value while maintaining the retarding voltage at the first voltage, and then increasing the coil current again until an in-focus state of the image is obtained, and a third step of computing the information on the hysteresis characteristics on the basis of a value of the coil current when the in-focus state was obtained in the second step.

* * * * *